United States Patent [19]

Kobayashi

[11] Patent Number: 5,407,782

[45] Date of Patent: Apr. 18, 1995

[54] METHOD OF FORMING RESIST PATTERN IN A MULTILAYER RESIST

[75] Inventor: Shun-ichi Kobayashi, Chiba, Japan

[73] Assignee: Kawasaki Steel Corporation, Hyogo, Japan

[21] Appl. No.: 940,195

[22] Filed: Sep. 2, 1992

[30] Foreign Application Priority Data

Sep. 6, 1991 [JP] Japan .................................. 3-227266
Mar. 24, 1992 [JP] Japan .................................. 4-065877

[51] Int. Cl.6 .............................................. G03C 1/492
[52] U.S. Cl. ...................................... 430/273; 430/5; 430/325; 430/967
[58] Field of Search .................... 430/273, 5, 325, 967

[56] References Cited

U.S. PATENT DOCUMENTS 4,515,876  5/1985  Yoshihara et al. ....................... 430/5
4,634,643  1/1987  Suzuki .................................... 430/5

FOREIGN PATENT DOCUMENTS 1-191130  8/1989  Japan .

OTHER PUBLICATIONS

E. Cullmann et al., "Experimental results with a scanning stepper for synchrotronbased x-ray lithography," Journal of Vacuum Science and Technology, vol. B6, Nov./Dec. 1988 p. 2132.

A. N. Broers, "Fine–Line Lithography," Microelectronic Materials and Processes, 1989, Chapter 9.

Book of Semi Standards 1986, vol. 5, Semiconductor Equipment and Materials Institute, Inc.

H. Kinoshita et al., "Soft x–ray reduction lithography using multilayer mirrors," Digest of Papers 1991 4th MicroProcess Conference, Jul. 15–18, 1992, Kanazawa, Japan.

Primary Examiner—Mark A. Chapman
Attorney, Agent, or Firm—Oliff & Berridge

[57] ABSTRACT

A multilayer photoresist includes an X-ray photoresist layer photosensitibe to X rays formed on a substrate, and a photoresist layer containing an X-ray absorbing agent formed on the X-ray photoresist layer. When the multilayer photoresist is selectively exposed to, for example, an I line (one spectrum), and developed, a mask to be used in the subsequent exposure to X rays is formed in the photoresist layer containing the X-ray absorbing agent. The X-ray photoresist layer on the substrate is then exposed to X rays by using the mask formed in the photoresist layer, and is developed, a resist pattern is obtained.

11 Claims, 21 Drawing Sheets

METHOD OF FORMING RESIST PATTERN IN A MULTILAYER RESIST

BACKGROUND OF THE INVENTION

1. Field of the Invention

The present invention relates to a multilayer resist and a method of forming a resist pattern using the multilayer resist, and in particular, to a multilayer resist which enables to utilize excellent duplication capability of X-ray lithography, and to a method of forming a highly accurate resist pattern with improved positioning accuracy and alignment accuracy.

2. Description of the Prior Art

Conventionally, when a fine pattern is to be duplicated or transferred on a photoresist layer by a photolithography technique, the exposure using the G line or I line is carried out to obtain high resolution. Furthermore, recently, for example, excimer laser lithography, phase shift technique, and the like have been developed for a photo-process for a semiconductor device which is required to be finer in structure. However, in these excimer laser lithography, phase shift technique, and the like, if the film thickness of the photoresist is thin, even a considerably fine pattern can be formed with high accuracy. In this case, however, a problem is involved in that the resist having such a thin film thickness cannot withstand various treatments or works in an LSI manufacturing process. Moreover, there is another problem in that it is difficult to obtain a practical pattern of 0.25 μm or less in the above-mentioned techniques.

Accordingly, as a method for obtaining a practical pattern of 0.25 μm or less, a proximity technique using X rays (wavelength=4 to 20 Å) is proposed. In this technique, X rays are radiated onto a photoresist layer through a transmission type equal-magnification mask having a desired pattern formed thereon, so that the pattern on the transmission type equal-magnification mask is duplicated or transferred to the photoresist layer. This technique is confirmed to be an excellent duplication technique in which very high resolution is obtained, and even a photoresist layer having a large film thickness can be formed with a very correct shape. However, since the above-mentioned X-ray proximity lithography employs equal-magnification projection, there is a problem in that the accuracy required for the mask is very severe, and the positioning accuracy and the alignment accuracy are insufficient. Thus, a manufacturing technique for a mask with high accuracy has not yet been established.

Accordingly, in order to solve such problems, an X-ray reduction lithography is proposed in which a reflection type mask is used, and the mask is irradiated by X rays, and a photoresist layer is irradiated by the reflected light. In this method, a pattern of 0.05 μm can be duplicated with high accuracy, and since reduced-magnification projection is used, the mask can be manufactured easily. However, due to the limitation to a multilayer film which can be used as an X-ray reflecting mirror, the wavelength of X rays usable at present is 100 Å or larger. The X rays having this wavelength of 100 Å or larger are absorbed in a photoresist layer to a great extent. For this reason, for example, when X rays having a wavelength of 100 to 200 Å are used, only a pattern having a film thickness of about 0.3 μm is obtained. Thus, there is a problem in that it is impossible to perform patterning of a photoresist layer having a thick film thickness, and it is impossible to obtain a photoresist pattern having a required thickness.

In the X-ray reduction lithography using the X rays mentioned above, another patterning method is proposed. In this method, a photoresist layer containing Si is formed on a thick duplication photoresist layer which is used for duplication, and only the photoresist layer containing Si is exposed to carry out patterning. The photoresist layer containing Si after patterning is used as a mask, and the duplication photoresist layer is subjected to anisotropic etching ($O_2$-RIE) using oxygen thereby to perform patterning on the duplication photoresist layer. Here, the above-mentioned photoresist layer containing Si is formed to have a film thickness equal to or smaller than a depth of intrusion of the X rays used in the reduced-magnification projection exposure. In this method, since the duplication photoresist layer is patterned by the $O_2$-RIE, even when the X rays having a wavelength of 100 to 200 Å is used, a photoresist pattern having a required thickness can be obtained.

However, in the recuded-magnification projection exposure method utilizing the $O_2$-RIE, the problem is involved in that the damage of a substrate due to the $O_2$-RIE is large, and the reliability of a semiconductor device is degraded. Furthermore, since the $O_2$-RIE is carried out within a vacuum apparatus, the throughput is poor.

A prior art method of suppressing the occurrence of the damage of the substrate is disclosed in Japanese Patent Laid-Open Publication Hei No. 1-191130. In this prior art method, in a process of forming on a matter to be treated a novolak positive resist layer constituting a first resist layer and a novolak positive resist layer constituting a second resist layer respectively having different wavelengths to which the resist layers are photosensitive, as the second resist layer, a novelak resist containing a photosensitive agent composed of 1,2-naphthoquinone diazide-5-sulphonic acid, and a light absorbing agent having a light absorbing property to a short wavelength of 420 nm is used. As a result, an aimed thicknes of the photoresist pattern can be formed without using the $O_2$-RIE process. However, it is difficult to obtain a practical pattern of 0.25 μm or less in accordance with the prior art method disclosed in the Japanese Patent Laid-Open Publication Hei No. 1-191130, because of applying a mercury emission line for lithography

SUMMARY OF THE INVENTION

The present invention is intended to solve the problems, and it is an object of the invention to provide a multilayer resist which enables to utilize the duplication capability of the X-ray lithography, and to provide a method of manufacturing a resist pattern with high accuracy and in which the positioning accuracy and the alignment accuracy are improved.

In order to achieve the object, in a first aspect of the present invention there is provided with a multilayer resist comprising a photoresist layer containing an X-ray absorbing agent formed on an X-ray photoresist layer.

Furthermore, in a second aspect of the present invention there is provided with a method of manufacturing a resist pattern which uses a multilayer resist, comprising a first step of forming an X-ray photoresist layer photosensitive to X rays on a substrate, a second step of forming a photoresist layer containing an X-ray absorbing agent on the X-ray photoresist layer, a third step of selectively exposing the photoresist layer containing the X-ray absorbing agent to form an image portion and a non-image portion, a fourth step of selectively removing the non-image portion of the photoresist layer containing the X-ray absorbing agent, and a fifth step of exposing the X-ray photoresist layer to the X rays by using as a mask the image portion of the photoresist layer containing the X-ray absorbing agent.

Furthermore, in a third aspect of the present invention there is provided with a method of forming a resist pattern which uses a multilayer resist, comprising a first step of forming an X-ray photoresist layer photosensitive to X rays on a substrate, a second step of selectively performing reduction lithography of the X-ray photoresist layer by using the X rays to form an image portion and a non-image portion, a third step of selectively diffusing an X-ray absorbing agent into the image portion of the X-ray photoresist layer, a fourth step of selectively removing the non-image portion of the X-ray photoresist layer, and a fifth step of performing X-ray proximity lithography of the X-ray photoresist layer after the selective removal thereof by using the X rays having a wavelength which is absorbed by the X-ray absorbing agent and by using as a mask the X-ray photoresist layer diffused with the X-ray absorbing agent.

Furthermore, in a fourth aspect of the present invention there is provided with a method of forming a resist pattern which uses a multilayer resist, comprising a first step of forming a first X-ray photoresist layer photosensitive to X rays on a substrate, a second step of forming on the first X-ray photoresist layer a second X-ray photoresist layer which contains an X-ray absorbing agent and which is photosensitive to X rays having a wavelength, at which wavelength a small amount of the X rays are absorbed by the X-ray absorbing agent, a third step of selectively performing reduction lithography of the second X-ray photoresist layer by using the X rays having the wavelength, at which wavelength a small amount of the X rays are absorbed, to form an image portion and a non-image portion, a fourth step of selectively removing the non-image portion of the second X-ray photoresist layer, and a fifth step of performing proximity lithography of the first X-ray photoresist layer by using as a mask the second X-ray photoresist layer after the selective removal thereof and by using the X rays having a wavelength which is absorbed by the X-ray absorbing agent.

Furthermore, in a fifth aspect of the present invention there is provided with a method of manufacturing a resist pattern which uses a multilayer resist, comprising a first step of forming a first X-ray photoresist layer photosensitive to X rays on a substrate, a second step of forming an X-ray absorbing layer on the first X-ray photoresist layer, a third step of forming on the X-ray absorbing layer a second X-ray photoresist layer photosensitive to the X rays, a fourth step of selectively performing reduction lithography of the second X-ray photoresist layer by using the X rays to form an image portion and a non-image portion, a fifth step of selectively removing the non-image portion of the second X-ray photoresist layer, a sixth step of removing the second X-ray photoresist layer after the X-ray absorbing layer is selectively removed by using as a mask the second X-ray photoresist layer after the selective removal thereof, and a seventh step of performing proximity lithography of the first X-ray photoresist layer by using as a mask the X-ray absorbing layer after the selective removal thereof and by using the X rays having a wavelength which is absorbed by the X-ray absorbing layer.

Furthermore, in a sixth aspect of the present invention there is provided with a method of manufacturing a resist pattern which uses a multilayer resist, comprising a first step of forming on a substrate a first positive X-ray photoresist layer photosensitive to X rays, a second step of forming on the first positive X-ray photoresist layer a second positive X-ray photoresist layer which has higher sensitivity than the first positive X-ray photoresist layer and which is photosensitive to the X rays, a third step of selectively performing reduction lithography of the second positive X-ray photoresist layer by using the X rays, a fourth step of selectively removing an exposed portion of the second positive X-ray photoresist layer, a fifth step of performing overall exposure of the second positive X-ray photoresist layer after the selective removal thereof and of the first positive X-ray photoresist layer which is exposed due to the selective removal thereof, by using the X rays having the same wavelength as that used in the reduction lithography, a sixth step of forming an X-ray absorbing layer on an upper surface of both the positive X-ray photoresist layers, the X-ray absorbing layer has a film thickness thinner than a film thickness of the second X-ray photoresist layer, a seventh step of selectively removing the second X-ray photoresist layer and the X-ray absorbing layer formed on the upper surface of the second X-ray photoresist layer, and an eighth step of performing proximity lithography of the first X-ray photoresist layer by using as a mask the X-ray absorbing layer after the selective removal thereof and by using the X rays having a wavelength which is absorbed by the X-ray absorbing layer.

Furthermore, in a seventh aspect of the present invention there is provided with a method of forming a resist pattern which uses a multilayer resist, comprising a first step of forming on a substrate a positive X-ray photoresist layer photosensitive to X rays, a second step of selectively performing reduction lithography of the positive X-ray photoresist layer by using the X rays, a third step of selectively removing an exposed portion of the positive X-ray photoresist layer, a fourth step of performing overall exposure of the positive X-ray photoresist layer after the selective removal thereof by using the X rays having a wavelength the same as that used in the reduction lithography, a fifth step of forming an X-ray absorbing layer on an upper surface of the positive X-ray photoresist layer after the overall exposure thereof, the X-ray absorbing layer having a film thickness thinner than a step portion caused in the positive X-ray photoresist layer due to the selective removal thereof, a sixth step of selectively removing the positive X-ray photoresist layer having the X-ray absorbing layer formed thereon, and a seventh step of performing proximity lithography of the positive X-ray photoresist layer by using as a mask the X-ray absorbing layer after the selective removal thereof and by using the X rays having a wavelength which is absorbed by the X-ray absorbing layer.

The technical effects in the present invention are as follows.

In the first aspect of the invention, in the multilayer resist formed by providing the photoresist layer containing the X-ray absorbing agent on the X-ray photoresist layer, when the photoresist layer containing the X-ray absorbing agent is patterned by a conventional exposure method, the multilayer resist can be used as a mask for patterning the X-ray photoresist layer. Accordingly, it is possible to perform pattern duplication with high accuracy by utilizing X-ray lithography without encountering the difficulty of manufacturing a mask.

Specifically, it is only required that the photoresist layer containing the X-ray absorbing agent which constitutes a pattern drawn layer has a thickness required as a mask for patterning the X-ray photoresist layer. Accordingly, the film thickness of the photoresist layer containing the X-ray absorbing agent may be thinner than a resist having a practical film thickness applicable to an LSI manufacturing process, namely, such a thin film thickness which enables to form a considerably fine pattern with good accuracy when exposed by using a usual exposure method, for example, photolithography, excimer laser lithography, phase shift, or the like. Thus, since the above-mentioned mask can be formed with very high accuracy, the excellent duplication capability of the X-ray lithography can be utilized sufficiently.

In the second aspect of the invention, after forming the X-ray photoresist layer and the photoresist layer containing the X-ray absorbing agent on the substrate, by selectively exposing and developing the resultant layers, the patterning of the photoresist layer containing the X-ray absorbing agent can be performed with high accuracy. Thereafter, when the X-ray exposure is carried out, since the patterned photoresist layer containing the X-ray absorbing agent serves as a mask for the X-ray exposure, it is possible to pattern the X-ray photoresist layer with good accuracy. Subsequently, by developing, it is possible to manufacture a highly accurate resist pattern in which the positioning accuracy and the alignment accuracy are improved.

In the third aspect of the invention, by selectively performing the reduction lithography of the X-ray photoresist layer photosensitive to X rays by using the X rays, it is possible to form the image portion and the non-image portion in an upper layer of the X-ray photoresist layer. By selectively diffusing the X-ray absorbing agent into the image portion, and by selectively removing the non-image portion, it is possible to form on the X-ray photoresist layer a fine pattern comprised of the X-ray photoresist layer diffused with the X-ray absorbing agent. Subsequently, when performing the proximity lithography by using the fine pattern as a mask and by using the X ray having a wavelength absorbed by the X-ray absorbing agent, the fine pattern can be duplicated in a depth direction of the X-ray photoresist layer with good accuracy.

Specifically, the mask for the proximity lithography can be formed by patterning by the reduction lithography. As a result, the proximity lithography can be carried out by using a mask having the very accurate fine pattern formed therein without encountering the difficulty of manufacturing the mask. Furthermore, the fine pattern obtained by the reduction lithography is only required to have a film thickness capable of performing the function as a mask for the proximity lithography, the film thickness which is obtained by the reduction lithography is sufficient. For this reason, the defects of the reduction lithography and the proximity lithography can be compensated for to each other. Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

In the fourth aspect of the invention, on the first X-ray photoresist layer photosensitive to X rays, there is formed with the second X-ray photoresist layer containing the X-ray absorbing agent and being photosensitive to X rays having a wavelength at which a small amount of the X rays is absorbed by the X-ray absorbing agent. The second X-ray photoresist layer is selectively subjected to the reduction lithography by using the X rays having a wavelength at which a small amount of the X rays is absorbed by the X-ray absorbing agent, and thus, the image portion and the non-image portion can be formed in the second X-ray photoresist layer. By selectively removing the non-image portion, a fine pattern comprised of the second X-ray photoresist layer can be formed on the first X-ray photoresist layer. Subsequently, by performing the proximity lithography by using the fine pattern as a mask and by using the X rays having a wavelength absorbed by the X-ray absorbing agent, the fine pattern can be duplicated in a depth direction of the first X-ray photoresist layer.

Specifically, the mask for the proximity lithography can be formed by patterning by the reduction lithography and furthermore, since the fine pattern obtained by the reduction lithography is only required to have a film thickness capable of performing the function as a mask for the proximity lithography, the film thickness which is obtained by the reduction lithography is sufficient. For this reason, the defects of the reduction lithography and the equal-magnification projection exposure can be compensated for to each other. Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

In the fifth aspect of the invention, the first X-ray photoresist layer photosensitive to X rays, the X-ray absorbing layer, and the second X-ray photoresist layer photosensitive to X rays are sequentially formed, and thereafter, the reduction lithography of the second X-ray photoresist layer is performed by using the X rays. Thus, the image portion and the non-image portion can be formed in the second X-ray photoresist layer. After selectively removing the non-image portion and the X-ray absorbing layer formed on a region corresponding to the non-image portion, by further removing the second X-ray photoresist layer, it is possible to form a fine pattern of the X-ray absorbing layer on the first X-ray photoresist layer. Subsequently, by performing the proximity lithography by using the fine pattern as a mask and by using the X rays having a wavelength absorbed by the X-ray absorbing agent, the fine pattern can be duplicated in a depth direction of the first X-ray photoresist layer with good accuracy.

Specifically, the mask for the proximity lithography can be formed by patterning by the reduction lithography, and furthermore, since the fine pattern obtained by the reduction lithography is only required to have a film thickness capable of performing the function as a mask for the proximity lithography, the film thickness which is obtained by the reduction lithography is sufficient. For this reason, the defects of the reduction lithography and the proximity lithography can be compensated for to each other. Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

In the sixth aspect of the invention, on the first positive X-ray photoresist layer photosensitive to X rays, there is formed with the second positive X-ray photoresist layer having higher sensitivity than the first positive X-ray photoresist layer and being photosensitive to the X rays. Following this, the reduction lithography of the second positive X-ray photoresist layer is performed by using the X rays, and then, by selectively removing the exposed portion of the second positive X-ray photoresist layer, the fine pattern of the second X-ray photoresist layer can be formed on the first positive X-ray photoresist layer. Subsequently, the second positive X-ray photoresist layer after the selective removal thereof, and the exposed first positive X-ray photoresist layer are subjected to the overall exposure using the X rays having the same wavelength as that used in the reduction lithography, and then, the X-ray absorbing layer is formed on the upper surface of both the positive photoresist layers in which the X-ray absorbing layer has a film thickness thinner than that of both the positive photoresist layers. Thereafter, by selectively removing the second positive X-ray photoresist layer and the X-ray absorbing layer formed on the upper surface of the second positive X-ray photoresist layer, the fine pattern of the X-ray absorbing layer is formed on the first positive X-ray photoresist layer.

Specifically, since the X-ray absorbing layer is formed to have the film thickness thinner than that of the second positive X-ray photoresist layer, in the process of removing both the positive photoresist layers after the overall exposure, for example, in performing a treatment using a developer, the developer intrudes into the second positive X-ray photoresist layer, but it is difficult to intrude into the first positive X-ray photoresist layer because the X-ray photoresist layer acts as a mask. Furthermore, since the second positive X-ray photoresist layer has the higher sensitivity than the first positive X-ray photoresist layer, it is easily developed. Accordingly, only the second positive X-ray photoresist layer is easily lift off without adversely affecting the first positive X-ray photoresist layer. As a result, it is possible to form the fine pattern of the X-ray absorbing layer on the first positive X-ray photoresist layer.

Subsequently, by performing the proximity lithography by using as a mask the fine pattern of the X-ray absorbing layer and by using the X rays having a wavelength absorbed by the X-ray absorbing layer, the fine pattern can be duplicated in the depth direction of the first positive X-ray photoresist layer with good accuracy.

Specifically, since the patterning of the mask for the proximity lithography can be performed by the reduction lithography, and since the fine pattern constituted by the second positive X-ray photoresist layer obtained by the reduction lithography is only required to have a film thickness which enables to form the X-ray absorbing layer which is formed later, the film thickness obtained by the reduction lithography is sufficient. As a result, the defects of the reduction lithography and the proximity lithography can be compensated for to each other. Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

In the seventh aspect of the invention, the positive X-ray photoresist layer photosensitive to X rays is subjected to the reduction lithography by using the X rays, and the exposed portion of the positive X-ray photoresist layer is selectively removed so that the fine pattern can be formed on the positive X-ray photoresist layer. Thereafter, after performing the overall exposure of the positive X-ray photoresist layer having the fine pattern formed thereon by using the X rays having the same wavelength as that used in the reduction lithography, the X-ray absorbing layer is formed on the upper surface of the positive X-ray photoresist layer in which the X-ray absorbing layer has the film thickness thinner than the step portion caused in the positive X-ray photoresist layer by the selective removal thereof. Thereafter, by selectively removing the positive X-ray photoresist layer having the X-ray absorbing layer formed thereon, the fine pattern constituted by the X-ray absorbing layer can be formed on the positive X-ray photoresist layer.

Specifically, since the X-ray absorbing layer is formed with the film thickness thinner than the step portion of the positive X-ray photoresist layer, in the process of removing the positive X-ray photoresist layer, for example, when a treatment using the developer, the developer intrudes into a convex portion (the non-exposed portion in the reduction lithography) of the positive X-ray photoresist layer, however, the developer is difficult to intrude into a concave portion (the exposed portion in the reduction lithography). As a result, it is possible to form the fine pattern constituted by the X-ray absorbing layer on the positive X-ray photoresist layer.

Subsequently, by performing the proximity lithography by using as a mask the fine pattern of the X-ray absorbing layer and by using the X rays having a wavelength absorbed by the X-ray absorbing layer, the fine pattern can be duplicated in the depth direction of the positive X-ray photoresist layer with good accuracy.

Specifically, since the patterning of the mask for the proximity lithography can be performed by the reduction lithography, and since the fine pattern constituted by the second positive X-ray photoresist layer obtained by the reduction lithography is only required to have a film thickness which enables to form the X-ray absorbing layer which is formed later, the film thickness obtained by the reduction lithography is sufficient. As a result, the defects of the reduction lithography and the proximity lithography can be compensated for to each other. Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

DESCRIPTION OF THE PREFERRED EMBODIMENTS

EXAMPLE 1

FIGS. 1 to 6 are partial sectional views each illustrating a manufacturing process of the resist pattern in Example i of the present invention.

Figure 1:
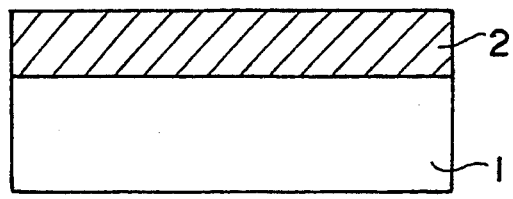
FIG. 1 is a partial sectional view illustrating a forming process of a resist pattern in Example 1 of the present invention.

First, in a process shown in FIG. 1, an X-ray photoresist layer 2 is formed on a substrate 1 of a wafer to a film thickness of about 1.0 μm by using a photoresist "RAY-PN" (trade name) manufactured by Hechist Co., or "ZEP-520" (trade name) manufactured by Nippon Zeon Co., which photoresist is made from a novolak family resin and excellent in dry etching resistant property.

Figure 2:
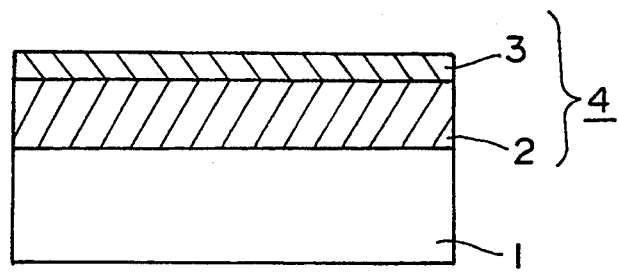
FIG. 2 is a partial sectional view illustrating a forming process of the resist pattern in Example 1 of the present invention.

Next, in a process shown in FIG. 2, a photoresist layer 3 containing an X-ray absorbing agent is formed on the X-ray photoresist layer 2 obtained in the process shown in FIG. 1 to a thin film thickness of about 0.2 to 0.5 μm by using a photoresist "FH-SP" (trade name) manufactured by Fuji-Hunt Electronics Technology, Japan, which photoresist contains Si (silicon) as the X-ray absorbing agent. In this manner, a multi-resist layer 4 comprised of the X-ray photoresist layer 2 and the photoresist layer 3 containing the X-ray absorbing agent is formed on the substrate 1.

Subsequently, in a process shown in FIG. 3, the multi-resist layer 4 obtained in the process shown in FIG. 2 is selectively exposed by using an I line and a phase shift technique, and a pattern having a width of about 0.2 μm is formed in the photoresist layer 3 containing the X-ray absorbing agent. Here, since the photoresist layer 3 containing the X-ray absorbing agent has the thin film thickness of about 0.2 to 0.5 μm, sufficient resolution can be obtained by the above-mentioned exposure method.

Figure 3:
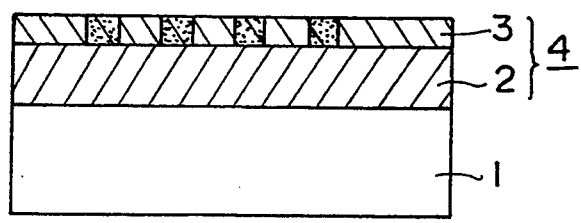
FIG. 3 is a partial sectional view illustrating a forming process of the resist pattern in Example 1 of the present invention.
Figure 4:
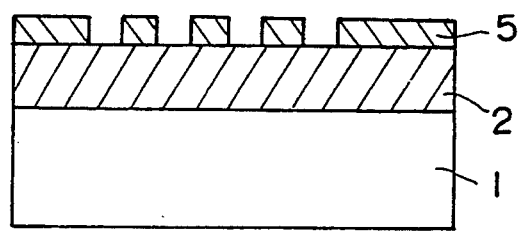
FIG. 4 is a partial sectional view illustrating a forming process of the resist pattern in Example 1 of the present invention.

In a process shown in FIG. 4, the substrate 1 obtained by the process shown in FIG. 3 is developed by using TMAH (tetra methyl ammonium hydro oxide), and a mask 5 for X-ray exposure is formed. This X-ray exposure mask 5 can be formed with high accuracy by the above-mentioned lithography technique in a simple manner. Accordingly, the X-ray exposure can be performed without encountering the difficulty in forming the mask which has been heretofore required in performing the X-ray exposure.

Figure 5:
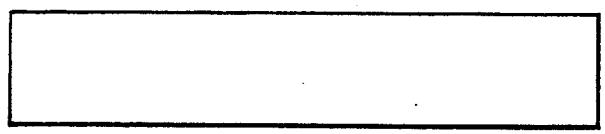
FIG. 5 is a partial sectional view illustrating a forming process of the resist pattern in Example 1 of the present invention.
Figure 5:
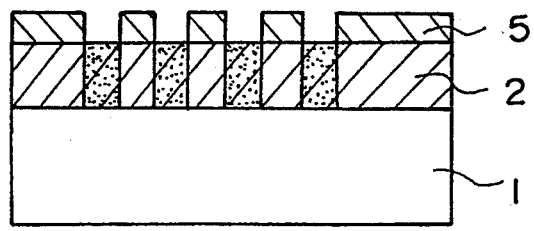

In a process shown in FIG. 5, the overall surface of the substrate 1 is subjected to X-ray exposure with a wavelength in a range from 44 to 80 Å by using SOR (synchrotoron orbital radiation) as a light source. At this time, since the X rays are absorbed by Si contained in the X-ray exposure mask 5, the X-ray photoresist layer 2 except for the region of the X-ray exposure mask 5 is exposed.

Figure 6:
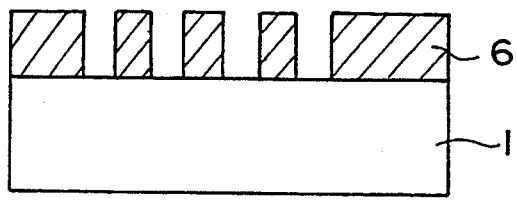
FIG. 6 is a partial sectional view illustrating a forming process of the resist pattern in Example 1 of the present invention.

In a process shown in FIG. 6, after working the X-ray exposure mask 5 obtained in the process shown in FIG. 5, the substrate 1 is developed by using the TMAH, and a resist pattern 6 is formed.

In this manner, it is possible to manufacture the highly accurate resist pattern 6 in which the positioning accuracy and the alignment accuracy are improved.

In the Example 1, in the process shown in FIG. 1, although the photoresist "RAY-PN" or "ZEP-520" is used as the X-ray photoresist layer 2, the photoresist is not limited to this, and other X-ray photoresists may be used as desired.

Also, in the process shown in FIG. 2, the photoresist "FH-SP" is used as the photoresist layer 3 containing the X-ray absorbing agent, however, other photoresists containing the X-ray absorbing agent may be used. Furthermore, as the X-ray absorbing agent, it is not limited to Si, and other X-ray absorbing agents such as W (tungsten), Ta (tantalum), or the like may be used, or a mixture of these materials may be used.

Also, in the process shown in FIG. 3, although the multi-resist layer 4 is selectively exposed by using the I line and the phase shift technique, it is not limited to this, and other exposure methods heretofore used, such as an electron beam technique or the like may be used.

Further, in the process shown in FIG. 5, although the X-ray exposure is performed by using the SOR as the light source, and using the wavelength of 44 to 80 Å, the X-ray exposure is not limited to this, and the source and wavelength the X-ray absorbing agent, and the type of the X-ray photoresist may be determined as desired.

EXAMPLE 2

FIGS. 7 to 10 are partial sectional views each illustrating a manufacturing process of a resist pattern in Example 2 of the present invention.

Figure 7:
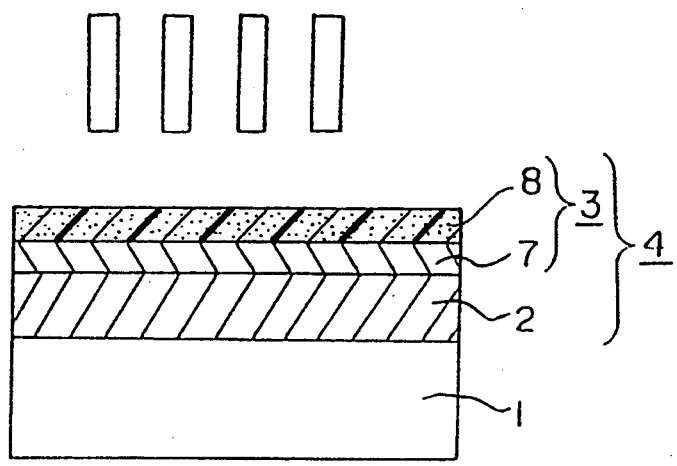
FIG. 7 is a partial sectional view illustrating a forming process of a resist pattern in Example 2 of the present invention.

First, in a process shown in FIG. 7, an X-ray photoresist layer 2 is formed on a substrate 1 of a wafer to a film thickness of about 1.0 μm by using a photoresist "RAY-PN" (trade name) manufactured by Hechist Co., or "ZEP-520" (trade name) manufactured by Nippon Zeon Co., which photoresist is made from a novolak family resin and excellent in dry etching resistant property.

Following this, an X-ray absorbing layer 7 is formed on the X-ray photoresist layer 2 to a film thickness of about 0.3 to 0.5 μm by using W as the X-ray absorbing agent.

Then, a photoresist layer 8 is formed on the X-ray absorbing layer 7 to a film thickness of about 0.3 to 0.5 μm by using as the photoresist for drawing a pattern a photoresist "ip-1800" (trade name) manufactured by Tokyo Ohka Kogyo, Co., Japan, which photoresist is made from a novolak family resin and excellent in a dry etching resistant property. In this manner, a photoresist layer 3 containing the X-ray absorbing agent and comprised of the X-ray absorbing layer 7 and the photoresist layer 8 is formed on the X-ray photoresist layer 2. Specifically, a multi-resist layer 4 comprised of the X-ray photoresist layer 2 and the photoresist layer 3 containing the X-ray absorbing agent is formed on the substrate 1.

Subsequently, similar to the Example 1, the multi-resist layer 4 is selectively exposed by utilizing the I line and the phase shift technique, and a pattern having a width of 0.2 μm and being highly accurate is formed in the photoresist layer 8 containing the X-ray absorbing agent. In this case, similar to the Example 1, since the photoresist layer 8 has a thin film thickness of about 0.3 to 0.5 μm, sufficient resolution can be obtained by the above-mentioned exposure method.

Figure 8:
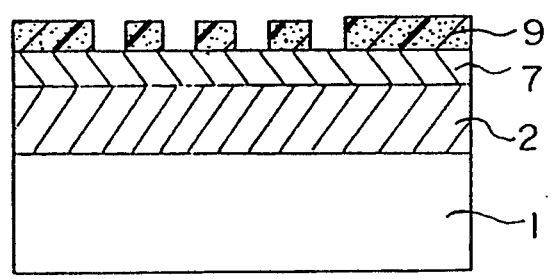
FIG. 8 is a partial sectional view illustrating a forming process of the resist pattern in Example 2 of the present invention.

Next, in a process shown in FIG. 8, the supporting board 1 obtained in the process shown in FIG. 7 is developed, and a resist pattern 9 is obtained.

Figure 9:
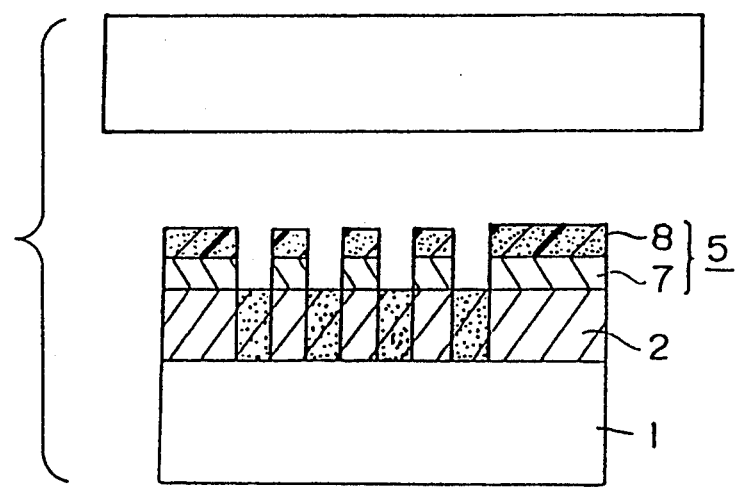
FIG. 9 is a partial sectional view illustrating a forming process of the resist pattern in Example 2 of the present invention.

In a process shown in FIG. 9, the X-ray absorbing layer 7 is etched by using as a mask the resist pattern 9 obtained in the process shown in FIG. 8, and by using an ECR technique. As a result, an X-ray exposing mask 5 (consisting of the photoresist layer 8 and the X-ray absorbing layer 7) is formed. Subsequently, the overall surface of the substrate 1 is subjected to X-ray exposure in a similar method as in Example 1.

Figure 10:
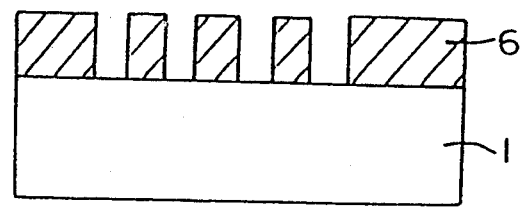
FIG. 10 is a partial sectional view illustrating a forming process of the resist pattern in Example 2 of the present invention.

In a process shown in FIG. 10, a similar treatment is performed as in the process shown in FIG. 6 in Example 1, a resist pattern 6 which is highly accurate is obtained with the positioning accuracy and the alignment accuracy improved.

While, in the process shown in FIG. 7, the tungsten (W) is used as the X-ray absorbing agent, other X-ray absorbing agents such as Ta and Si may be used.

EXAMPLE 3

In Example 3, as a light source for exposure, an SOR which enables to arbitrary determine a wavelength range by selecting a mirror and a filter, for example, "AURORA" (trade name) manufactured by Sumitomo Heavy Industries, Ltd., Japan is used. Also, in the reduction lithography, a multilayer film of Mo/Si is used as a pattern duplication mask, and a Schwarzschild type reflecting optical system is used.

FIGS. 11 to 16 are partial sectional views each illustrating a manufacturing process of a resist pattern in Example 2 of the present invention.

Figure 11:
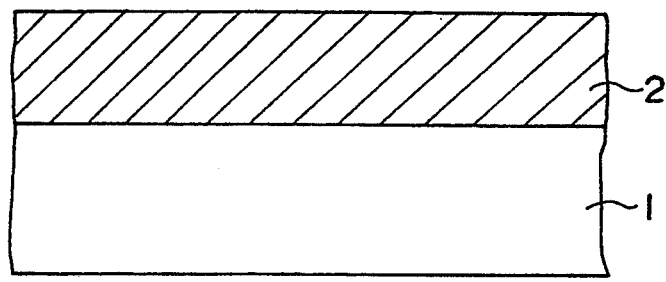
FIG. 11 is a partial sectional view illustrating a forming process of a resist pattern in Example 3 of the present invention.

In a process shown in FIG. 11, an X-ray photoresist layer 2 photosensitive to X rays is formed on a supporting board 1 to a film thickness of about 1.3 μm. In Example 3, as the X-ray photoresist layer 2, a positive photoresist "PLAZMASK" (trade name) manufactured by Japan Synthetic Rubber, Co., Japan is used. This photoresist is made from a novolak family resin, and it enables to be silylated, and it is excellent in a dry etching resistant property.

Subsequently, in a process shown in FIG. 12, the X-ray photoresist layer 2 obtained in the process shown in FIG. 11 is subjected to reduction lithography by using X rays having a wavelength of 130 Å. In this reduction lithography, an upper layer of 0.3 μm of the X-ray photoresist layer 2 is exposed, and this portion is an exposed portion 14. Furthermore, in this reduction lithography, it is possible to resolve up to a width of 0.05 μm sufficiently. Then, UV irradiation with an amount of irradiation of 800 to 1000 mJ/cm$^2$ is performed onto an overall surface of the X-ray photoresist layer 2 after the reduction lithography.

Figure 12:
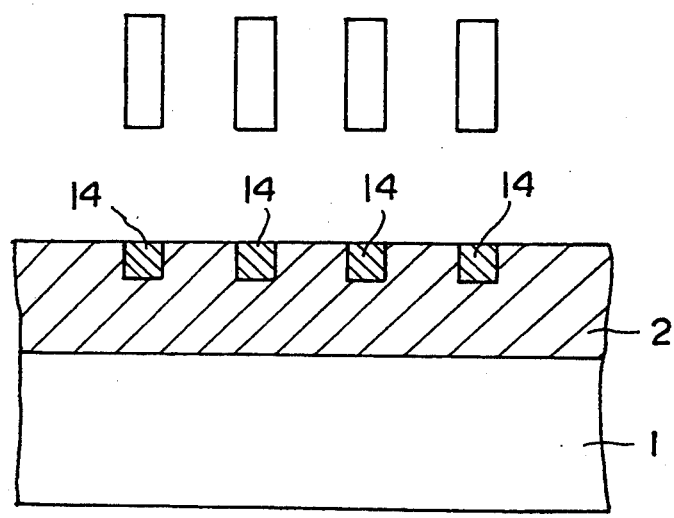
FIG. 12 is a partial sectional view illustrating a forming process of the resist pattern in Example 3 of the present invention.
Figure 13:
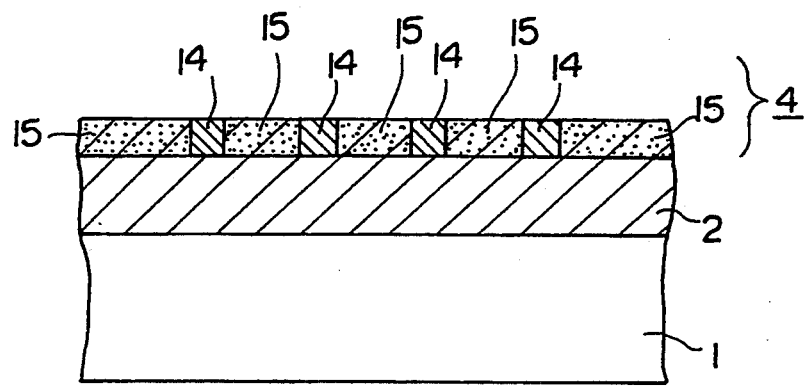
FIG. 13 is a partial sectional view illustrating a forming process of the resist pattern in Example 3 of the present invention.

In a process shown in FIG. 13, a non-exposed portion of the X-ray photoresist layer 2 obtained in the process shown in FIG. 12 is selectively silylated by using organic silane family gas, and an X-ray photoresist layer 15 having an X-ray absorbing agent diffused therein is formed. In this manner, a multi-resist layer 4 comprised of the X-ray photoresist layer 2 and the X-ray photoresist layer 15 having an X-ray absorbing agent diffused therein is obtained. The above-mentioned silylating treatment is carried out until the content of Si in the non-exposed portion is saturated. This Si is the X-ray absorbing agent, and the X rays used in proximity lithogrphy performed in a later process are absorbed.

Figure 14:
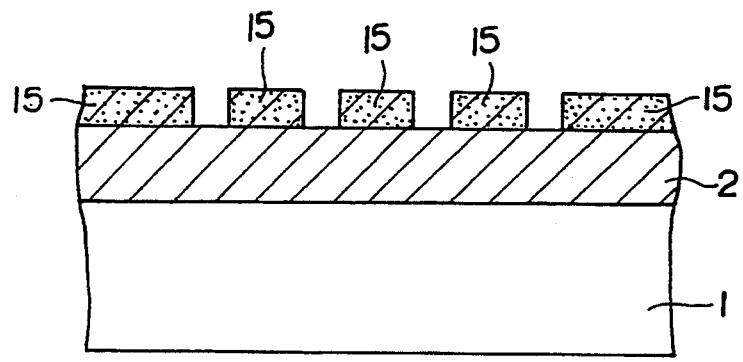
FIG. 14 is a partial sectional view illustrating a forming process of the resist pattern in Example 3 of the present invention.

In a process shown in FIG. 14, the exposed portion 14 obtained in the process shown in FIG. 12 is selectively removed, and a fine pattern constituted by the X-ray photoresist layer 15 having an X-ray absorbing agent diffused therein is formed on the X-ray photoresist layer 2. This fine pattern is used as a mask in proximity lithography performed in a later process, and since this mask is formed by patterning by the reduction lithography, it is very accurate.

Figure 15:
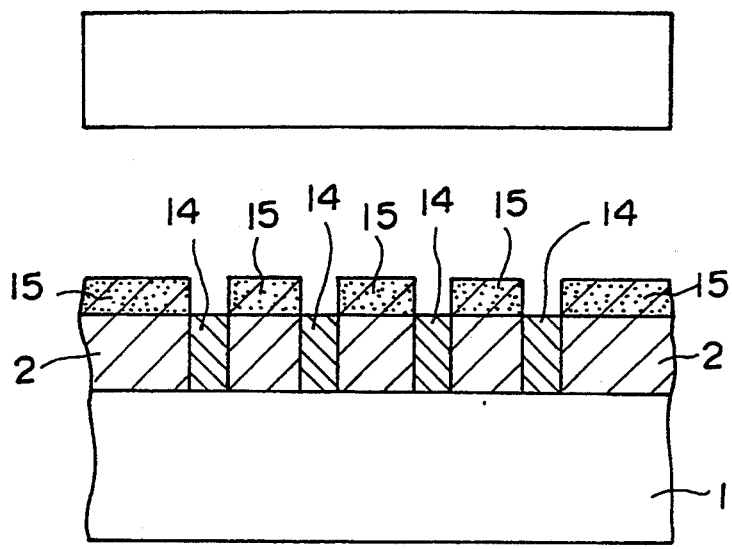
FIG. 15 is a partial sectional view illustrating a forming process of the resist pattern in Example 3 of the present invention.

In a process shown in FIG. 15, the proximity lithography of the X-ray photoresist layer 2 is performed by using as a mask the X-ray photoresist layer 15 obtained in the process shown in FIG. 14 and having an X-ray absorbing agent diffused therein, and by using X rays having a wavelength of 44 to 80 Å. At this time, for example, a width of about 10 Å at a long wavelength side of an absorption edge of carbon (C) is preferable. Since the X rays having the wavelength of 44 to 80 Å is absorbed by the X-ray absorbing agent, a region except for the X-ray photoresist layer 15 having the X-ray absorbing agent diffused therein becomes the exposed portion 14. In this manner, the fine pattern can be duplicated with good accuracy in a depth direction of the X-ray photoresist layer 2.

Figure 16:
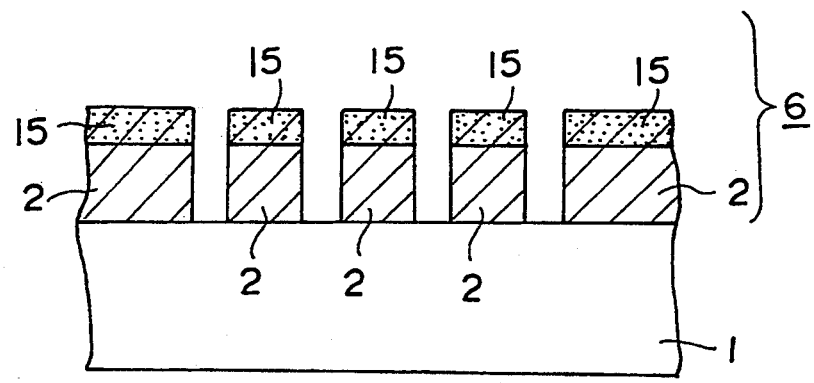
FIG. 16 is a partial sectional view illustrating a forming process of the resist pattern in Example 3 of the present invention.

In a process shown in FIG. 16, the exposed portion 14 obtained in the process shown in FIG. 15 is selectively removed, and a resist pattern 6 (comprised of the X-ray photoresist layer 15 and the X-ray photoresist layer 2) having a required film thickness and being highly accurate is formed on the substrate 1.

While, in Example 3, the positive X-ray photoresist layer is used, a negative X-ray photoresist layer may be used. In this case, the X-ray absorbing agent is diffused into the exposed portion.

EXAMPLE 4

In Example 4, as a light source for exposure, an SOR which enables to arbitrary determine a wavelength range by selecting a mirror and a filter, for example, "AURORA" (trade name) manufactured by Sumitomo Heavy Industries Ltd., Japan is used. Also, in the reduced-magnification projection exposure, a multilayer film of Mo/Si is used as a pattern duplication mask, and a Schwarzschild type reflecting optical system is used.

FIGS. 17 to 21 are partial sectional views each illustrating a manufacturing process of a resist pattern in Example 4 of the present invention.

Figure 17:
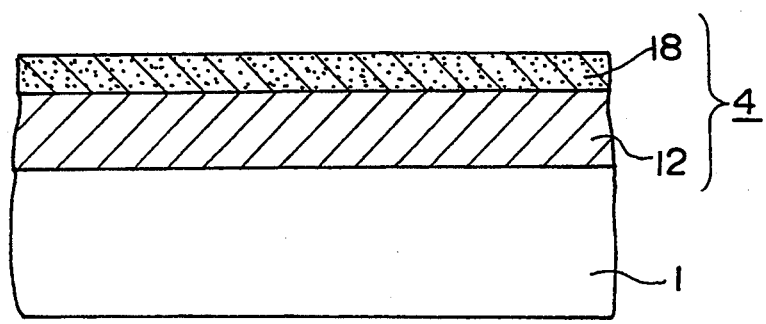
FIG. 17 is a partial sectional view illustrating a forming process of a resist pattern in Example 4 of the present invention.

In a process shown in FIG. 17, a first X-ray photoresist layer 12 photosensitive to X rays is formed on a substrate 1 to a film thickness of about 1.0 μm. In Example 4, as the first X-ray photoresist layer 12, a photoresist "RAY-PN" (trade name) or "ZEP-520" (trade name) mentioned in the foregoing, which is made form a novolak family resing and which is excellent in a dry etching resistant property is used. Subsequently, a second X-ray photoresist 18 is formed on the first X-ray photoresist 12 fo a film thickness of 0.3 μm. The second X-ray photoresist 18 contains Si as an X-ray absorbing agent, and is photosensitive to X rays having a wavelength at which an amount of X rays absorbed by the X-ray absorbing agent is small. In Example 4, as the second X-ray photoresist 18, a photoresist "FBMG" (trade name) manufactured by Fuji-Hunt Electronics Technology, Japan is used. In this manner, a multi-resist layer 4 comprised of the first X-ray photoresist 12 and the second X-ray photoresist 18 is formed.

Figure 18:
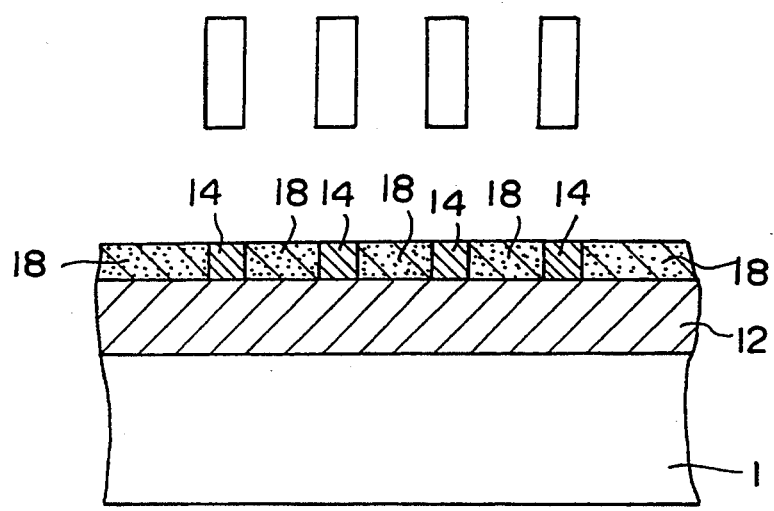
FIG. 18 is a partial sectional view illustrating a forming process of the resist pattern in Example 4 of the present invention.

In a process shown in FIG. 18, the second X-ray photoresist layer 18 obtained in the process shown in FIG. 17 is subjected to reduced-magnification projection exposure by using X rays having a wavelength of 130 Å, and an exposed portion 14 is formed, In this reduction lithography, it is sufficiently resolved up to a width of 0.05 μm.

Figure 19:
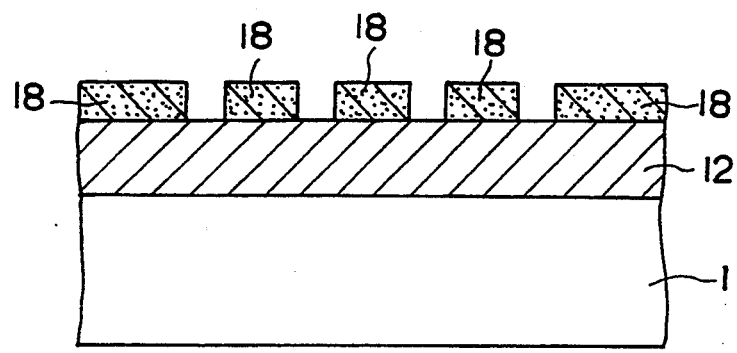
FIG. 19 is a partial sectional view illustrating a forming process of the resist pattern in Example 4 of the present invention.

In a process shown in FIG. 19, the exposed portion 14 obtained in the process shown in FIG. 18 is selectively removed, and a fine pattern constituted by the second X-ray photoresist layer 18 is formed on the X-ray photoresist layer 12. This fine pattern is used as a mask in proximity lithography performed in a later process, and since this mask is formed by patterning by the reduction lithography, it is very accurate.

Figure 20:
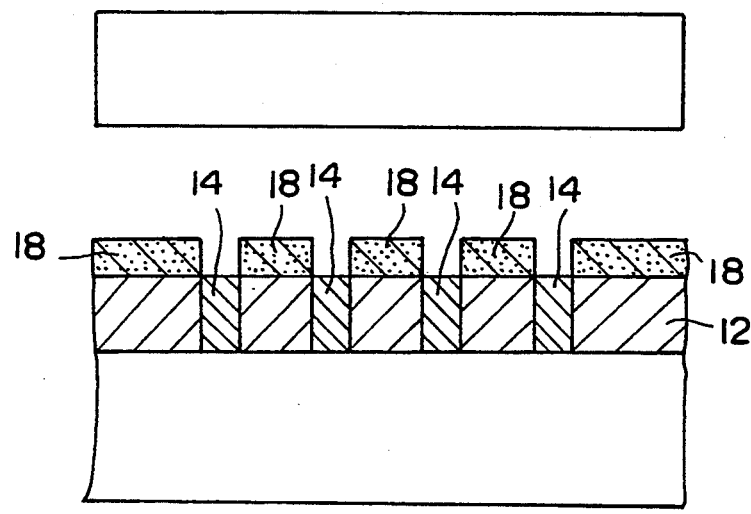
FIG. 20 is a partial sectional view illustrating a forming process of the resist pattern in Example 4 of the present invention.

In a process shown in FIG. 20, the proximity lithography of the first X-ray photoresist layer 12 is performed by using as a mask the X-ray photoresist layer 18 and by using X rays having a wavelength of 44 to 80 Å. At this time, a width of about 10 Å at a long wavelength side of an absorption edge of carbon (C) is preferable. Since the X rays having the wavelength of 44 to 80 Å is absorbed by the X-ray absorbing agent contained in the second X-ray photoresist layer 18, a region except for the second X-ray photoresist layer 18 becomes the exposed portion 14. In this manner, the fine pattern can be duplicated with good accuracy in a depth direction of the first X-ray photoresist layer 12.

Figure 21:
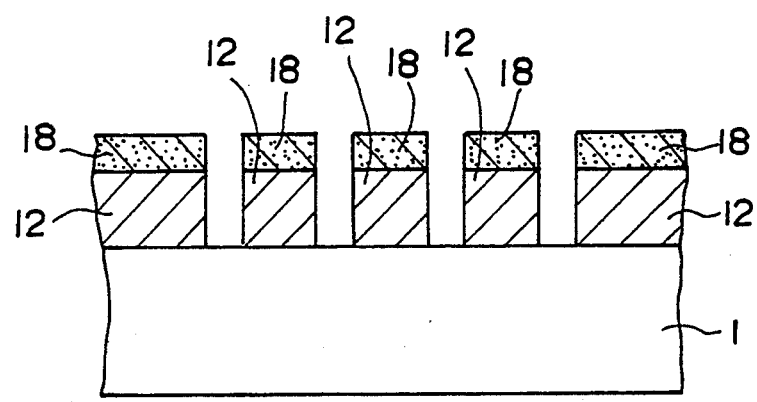
FIG. 21 is a partial sectional view illustrating a forming process of the resist pattern in Example 4 of the present invention.

In a process shown in FIG. 21, the exposed portion 14 obtained in the process shown in FIG. 20 is selectively removed, and a resist pattern 6 (comprised of the second X-ray photoresist layer 18 and the first X-ray photoresist layer 12) having a required film thickness and being highly accurate is formed on the supporting board 1.

While, in Example 4, the positive X-ray photoresist layer is used, a negative X-ray photoresist layer may be used.

EXAMPLE 5

In Example 5, as a light source for exposure, an SOR which enables to arbitrary determine a wavelength range by selecting a mirror and a filter, for example, "AURORA" (trade name) manufactured by Sumitomo Heavy Industries, Ltd., Japan is used. Also, in the reduction lithography, a multilayer film of Mo/Si is used as a pattern duplication mask, and a Schwarzschild type reflecting optical system is used.

FIGS. 22 to 26 are partial sectional views each illustrating a manufacturing process of a resist pattern in Example 5 of the present invention.

Figure 22:
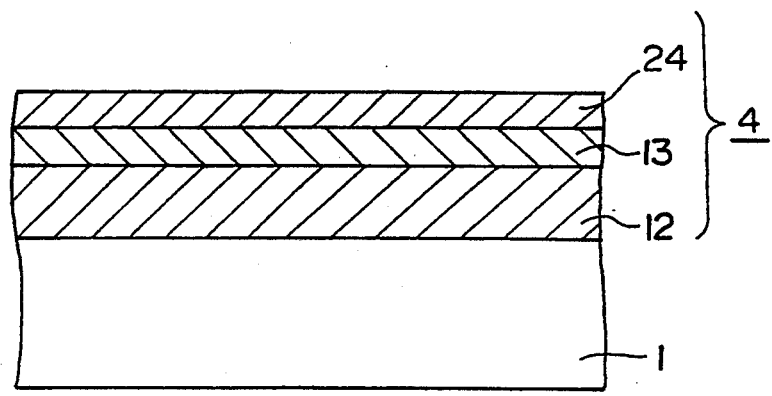
FIG. 22 is a partial sectional view illustrating a forming process of a resist pattern in Example 5 of the present invention.

In a process shown in FIG. 22, a first X-ray photoresist layer 12 photosensitive to X rays is formed on a substrate 1 to a film thickness of about 1.0 $\mu$m. In Example 5, as the first X-ray photoresist layer 12, a photoresist "RAY-PN" (trade name) or "ZEP-520" (trade name) mentioned in the foregoing, which is made from a novolak family resing and which is excellent in a dry etching resistant property is used. Subsequently, an X-ray absorbing layer 13 constituted by AuSi is formed on the first X-ray photoresist 12 to a film thickness of 0.1 $\mu$m. Then, a second X-ray photoresist 24 photosensitive to X rays is formed on the X-ray absorbing layer 13 to a film thickness of 0.3 $\mu$m. In Example 5, as the second X-ray photoresist 24, a photoresist "PMMA" (trade name) is used. In this manner, a multi-resist layer 4 comprised of the first X-ray photoresist 12, the X-ray absorbing layer 13, and the second X-ray photoresist 24 is formed.

Figure 23:
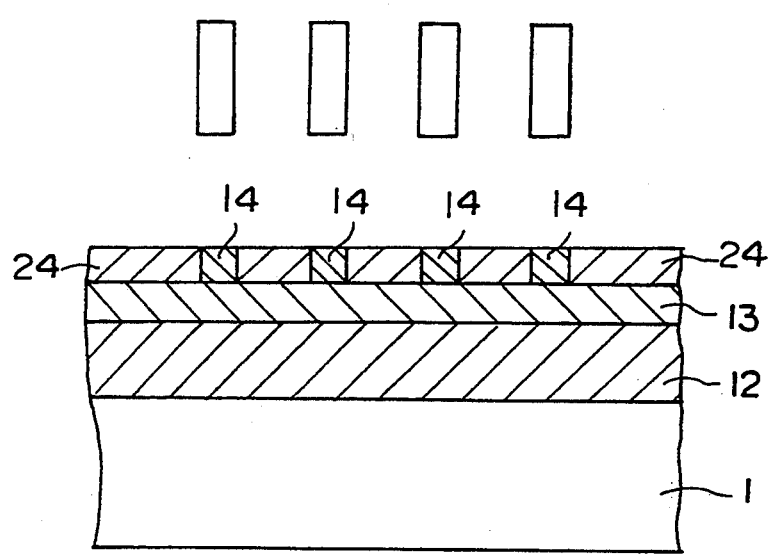
FIG. 23 is a partial sectional view illustrating a forming process of the resist pattern in Example 5 of the present invention.

In a process shown in FIG. 23, the second X-ray photoresist layer 24 obtained in the process shown in FIG. 22 is subjected to reduction lithography by using X rays having a wavelength of 110 521, and an exposed portion 14 is formed, In this reduction lithography, it is sufficiently resolved up to a width of 0.05 $\mu$m.

Figure 24:
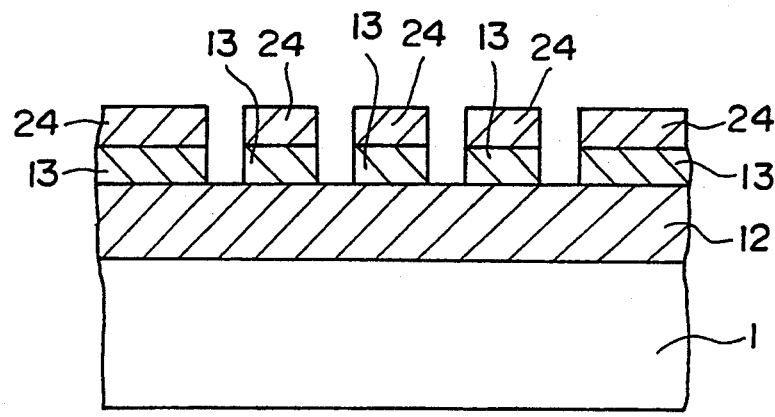
FIG. 24 is a partial sectional view illustrating a forming process of the resist pattern in Example 5 of the present invention.

In a process shown in FIG. 24, the exposed portion 14 obtained in the process shown in FIG. 23 is selectively removed. Then, gas-assisted reactive sputter etching is performed on the X-ray absorbing layer 13 by using as a mask the second X-ray photoresist layer 24 after the selective removal thereof, and by using ClF$_3$, or Ar gas, and the X-ray absorbing layer 13 is selectively removed.

Figure 25:
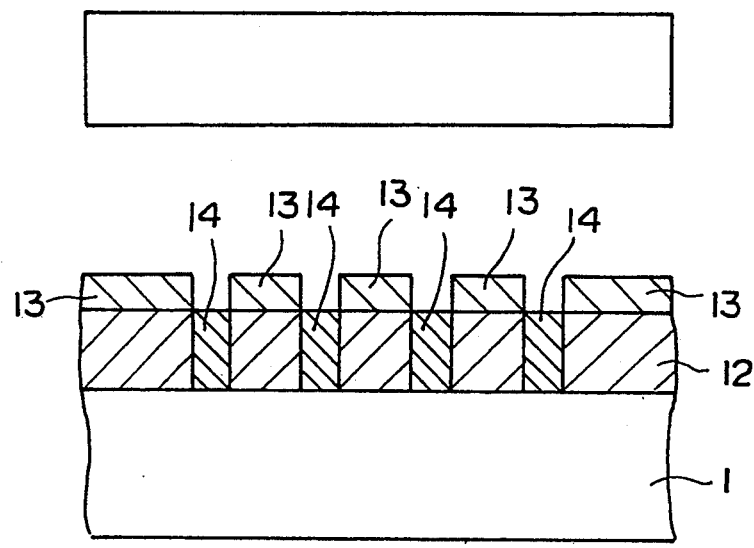
FIG. 25 is a partial sectional view illustrating a forming process of the resist pattern in Example 5 of the present invention.

In a process shown in FIG. 25, the second X-ray photoresist layer 24 obtained in the process shown in FIG. 24 is selectively removed, and a fine pattern constituted by the X-ray absorbing layer 13 is formed on the first X-ray photoresist layer 12. This fine pattern is used as a mask in proximity lithography performed in a later process, and since this mask is formed by patterning by the reduction lithography, it is very accurate. Subsequently, the proximity lithography of the first X-ray photoresist layer 12 is performed by using as a mask the X-ray absorbing layer 13, and by using X rays having a wavelength of 44 to 80 Å. At this time, for example, a width of about 10 Å at a long wavelength side of an absorption edge of carbon (C) is preferable. Since the X rays having the wavelength of 44 to 80 Å is absorbed by Au contained in the X-ray absorbing layer 13, a region except for the X-ray absorbing layer 13 becomes the exposed portion 14. In this manner, the fine pattern can be duplicated with good accuracy in a depth direction of the first X-ray photoresist layer 12.

Figure 26:
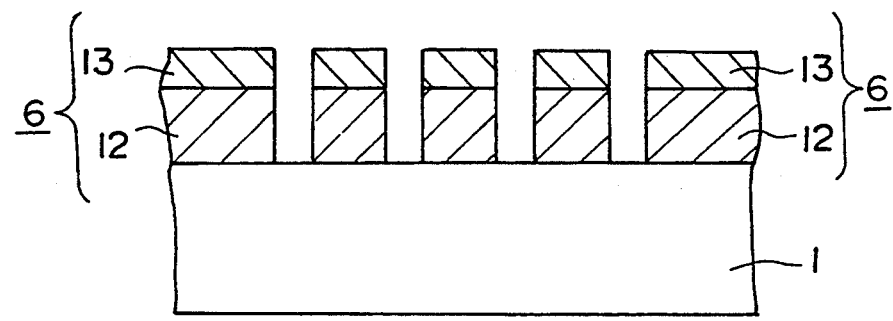
FIG. 26 is a partial sectional view illustrating a forming process of the resist pattern in Example 5 of the present invention.

In a process shown in FIG. 26, the exposed portion 14 obtained in the process shown in FIG. 25 is selectively removed, and a resist pattern 6 (copmrised of the X-ray absorbing layer 13 and the first X-ray photoresist layer 12) having a required film thickness and having a highly accurate pattern duplicated thereon is formed on the substrate 1.

While, in Example 5, the positive X-ray photoresist layer is used, a negative X-ray photoresist layer may be used.

Furthermore, in the process shown in FIG. 22, since the X-ray absorbing layer 13 comprised of AuSi is formed to the film thickness of about 0.1 $\mu$m, the proximity lithography is performed by using the X rays having the wavelength of 44 to 80 Å. However, the present invention is not limited to this, and an X-ray absorbing layer 13 comprised of Au may be formed to a film thickness of about 0.5 $\mu$m, and the proximity lithography may be performed by using the X rays having a wavelength of 4 to 10 Å.

Furthermore, in the process shown in FIG. 22, although the gas-assisted reactive sputter etching is applied to the X-ray absorbing layer by using ClF$_3$, or Ar gas, the present invention is not limited to this, and the etching may be performed under other conditions, for example, fluorine family gas, chlorine gas, or the like is used in place of ClF$_3$.

EXAMPLE 6

In Example 6, as a light source for exposure, an SOR which enables to arbitrary determine a wavelength range by selecting a mirror and a filter, for example, "AURORA" (trade name) manufactured by Sumitomo Heavy Industries, Ltd., Japan is used. Also, in the reduction lithography, a multilayer film of Mo/Si is used as a pattern duplication mask, and a Schwarzschild type reflecting optical system is used.

FIGS. 27 to 33 are partial sectional views each illustrating a manufacturing process of a resist pattern in Example 6 of the present invention.

Figure 27:
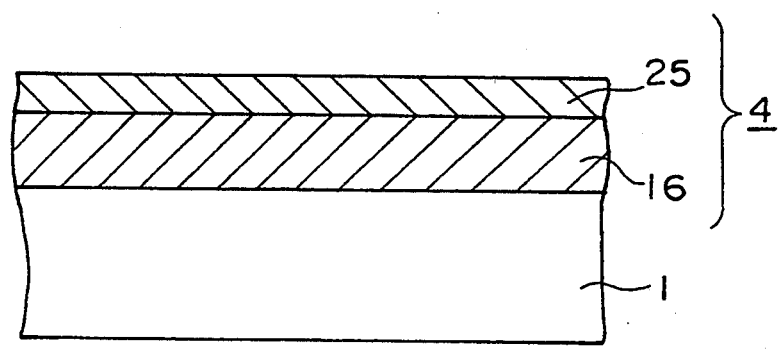
FIG. 27 is a partial sectional view illustrating a forming process of a resist pattern in Example 6 of the present invention.

In a process shown in FIG. 27, a first positive X-ray photoresist layer 16 photosensitive to X rays is formed on a substrate 1 to a film thickness of about 1.0 $\mu$m. In Example 6, as the first positive X-ray photoresist layer 16, a photoresist "ZCMR-100" (trade name) manufactured by Nippon Zeon Co., which is made from a novolak family resing and which is excellent in a dry etching resistant property is used. Subsequently, a second positive X-ray photoresist layer 25 which has higher sensitivity than the first positive X-ray photoresist layer 16 and which is photosensitive to X rays is formed on the first positive X-ray photoresist 16 fo a film thickness of 0.3 $\mu$m. In Example 6, as the second positive X-ray photoresist 25, a photoresist "ZEP-520" (trade name) manufactured by Nippon Zeon Co.,is used. In this manner, a multi-resist layer 4 comprised of the first positive X-ray photoresist 16, and the second positive X-ray photoresist 25 is formed.

Figure 28:
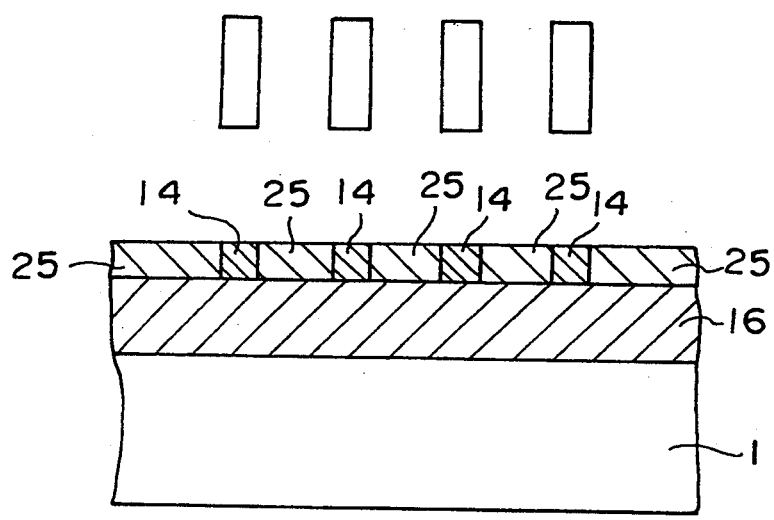
FIG. 28 is a partial sectional view illustrating a forming process of the resist pattern in Example 6 of the present invention.

In a process shown in FIG. 28, the second positive X-ray photoresist layer 25 obtained in the process shown in FIG. 27 is subjected to reduction lithography by using X rays having a wavelength of 130 Å, and an exposed portion 14 is formed, In this reduction lithography, it is sufficiently resolved up to a width of 0.05 $\mu$m.

Figure 29:
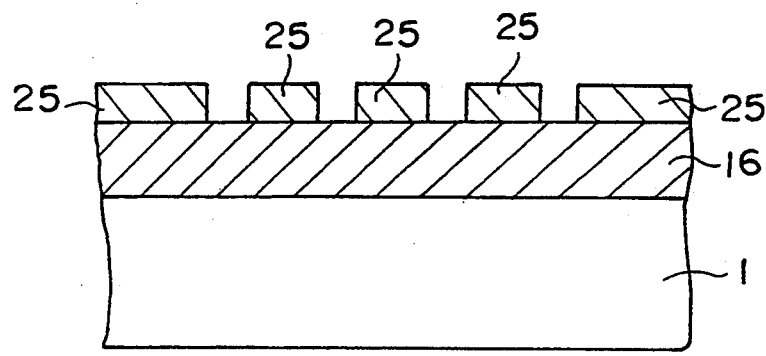
FIG. 29 is a partial sectional view illustrating a forming process of the resist pattern in Example 6 of the present invention.

In a process shown in FIG. 29, the exposed portion 14 obtained in the process shown in FIG. 28 is selectively removed. Thereafter, the second positive X-ray photoresist layer 25 and the exposed first positive X-ray photoresist layer 16 are subjected to overall exposure by using the X rays having the same wavelength as that used in the reduction lithography. Here, since the second positive X-ray photoresist layer 25 has higher sensitivity than the first positive X-ray photoresist layer 16, it is completely exposed.

Figure 30:
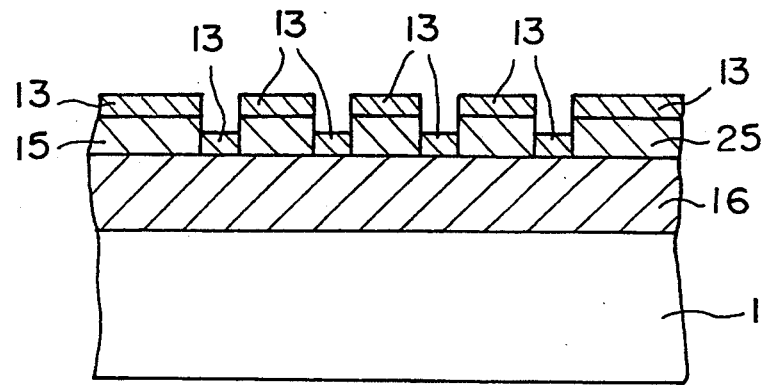
FIG. 30 is a partial sectional view illustrating a forming process of the resist pattern in Example 6 of the present invention.

In a process shown in FIG. 30, gold (Au) is deposited by sputtering on an upper surface of the first positive X-ray photoresist layer 16 and the second positive X-ray photoresist layer 25 which have been overall exposed in the process shown in FIG. 29, and an X-ray absorbing layer 13 having a film thickness of about 0.1 to 0.2 $\mu$m is formed. Here, the X-ray absorbing layer 13 is formed to have the film thickness thinner than the film thickness of the second positive X-ray photoresist layer 25.

Figure 31:
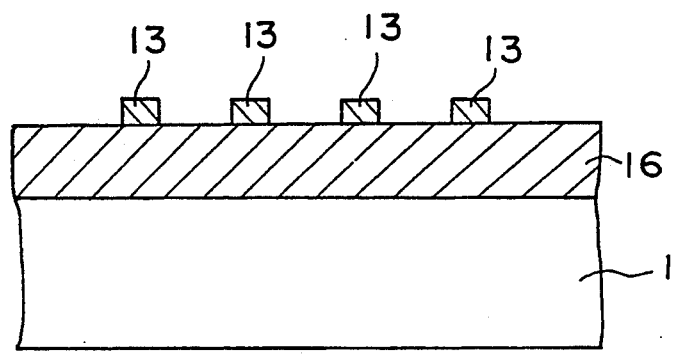
FIG. 31 is a partial sectional view illustrating a forming process of the resist pattern in Example 6 of the present invention.

In a process shown in FIG. 31, the first positive X-ray photoresist layer 16 and the second positive X-ray photoresist layer 25 which have been overall exposed in the process shown in FIG. 29 are subjected to wet etching by using a desired developer, for example, "NMD-3" (trade name) manufactured by Tokyo Ohka Kogyo, Co., Japan. At this time, since side walls of the second positive X-ray photoresist layer 25 are exposed, the developer intrudes into these portions, however, since the X-ray absorbing layer 13 serves as a mask for the first positive X-ray photoresist layer 16, the developer is difficult to intrudes into the first positive X-ray photoresist layer 16. Furthermore, since the second positive X-ray photoresist layer 25 has the higher sensitivity than the first positive X-ray photoresist layer 16, it is more easily developed. Accordingly, only the second positive X-ray photoresist layer 25 is lift off. In this manner, a fine pattern constituted by the X-ray absorbing layer 13 is formed on the first positive X-ray photoresist layer 16. This fine pattern is used as a mask for proximity lithography performed in a later process, however, since this mask has been patterned by the reduction lithography, it is highly accurate.

Figure 32:
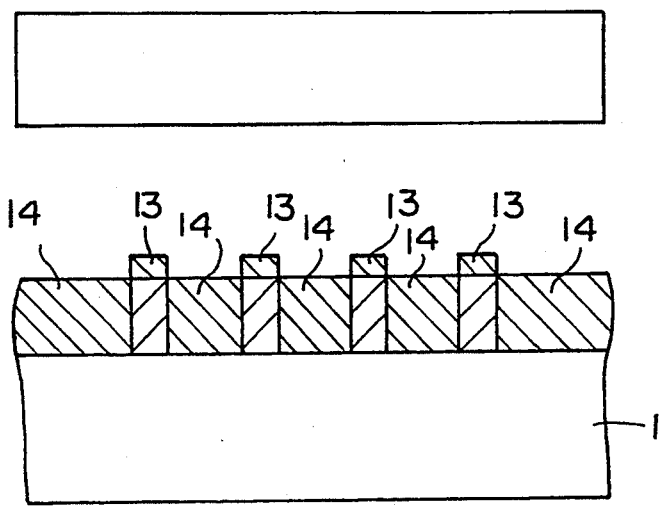
FIG. 32 is a partial sectional view illustrating a forming process of the resist pattern in Example 6 of the present invention.

In a process shown in FIG. 32, the proximity lithography of the first positive X-ray photoresist layer 16 is performed by using as a mask the X-ray absorbing layer 13 obtained in the process shown in FIG. 31, and by using X rays having a wavelength of 44 to 80 Å. At this time, for example, a width of about 10 Å at a long wavelength side of an absorption edge of carbon (C) is preferable. Since the X rays having the wavelength of 44 to 80 Å is absorbed by the X-ray absorbing layer 13, a region except for the X-ray absorbing layer 13 becomes the exposed portion 14. In this manner, the fine pattern can be duplicated with good accuracy in a depth direction of the X-ray photoresist layer 16.

Figure 33:
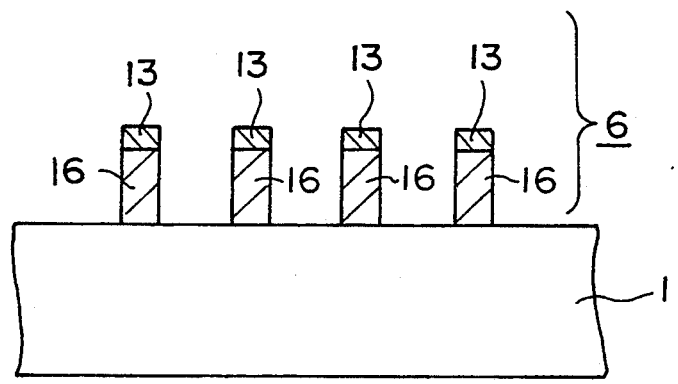
FIG. 33 is a partial sectional view illustrating a forming process of the resist pattern in Example 6 of the present invention.

In a process shown in FIG. 33, the exposed portion 14 obtained in the process shown in FIG. 32 is selectively removed, and a resist pattern 6 (comprised of the X-ray absorbing layer 13 and the X-ray photoresist layer 16) having a required film thickness and having a highly accurate pattern duplicated thereon is formed on the substrate 1.

Here, in Example 6, in the process shown in FIG. 30, the X-ray absorbing layer 13 comprised of Au is formed to have the film thickness of about 0.1 $\mu$m. Thus, in the process shown in FIG. 32, the proximity lithography is performed by using the X rays having the wavelength of 44 to 80 Å. However, if the X-ray absorbing layer 13 is formed to the film thickness of about 0.5 $\mu$m, it will be possible to perform the proximity lithography by using the X rays having the wavelength of 4 to 10 Å, or preferably 6 to 10 Å, and the duplication accuracy will be more improved.

EXAMPLE 7

In Example 7, as a light source for exposure, an SOR which enables to arbitrary determine a wavelength range by selecting a mirror and a filter, for example, "AURORA" (trade name) manufactured by Sumitomo Heavy Industries, Ltd., Japan is used. Also, in the reduction lithography, a multilayer film of Mo/Si is used as a pattern duplication mask, and a Schwarzschild type reflecting optical system is used.

FIGS. 34 to 39 are partial sectional views each illustrating a manufacturing process of a resist pattern in Example 7 of the present invention.

Figure 34:
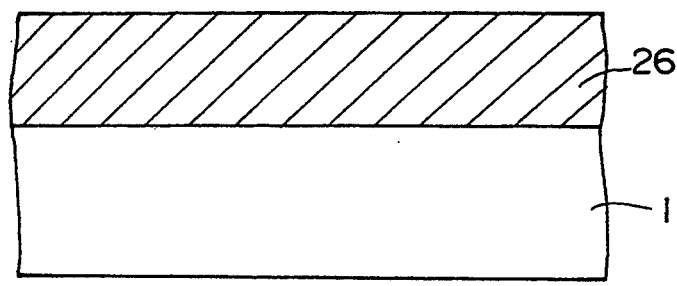
FIG. 34 is a partial sectional view illustrating a forming process of a resist pattern in Example 7 of the present invention.

In a process shown in FIG. 34, a positive X-ray photoresist layer 26 photosensitive to X rays is formed on a substrate 1 to a film thickness of about 1.3 $\mu$m. In Example 7, as the positive X-ray photoresist layer 26, a photoresist "RAY-PN" (trade name) or "ZEP-520" (trade name) mentioned in the foregoing is used.

Figure 35:
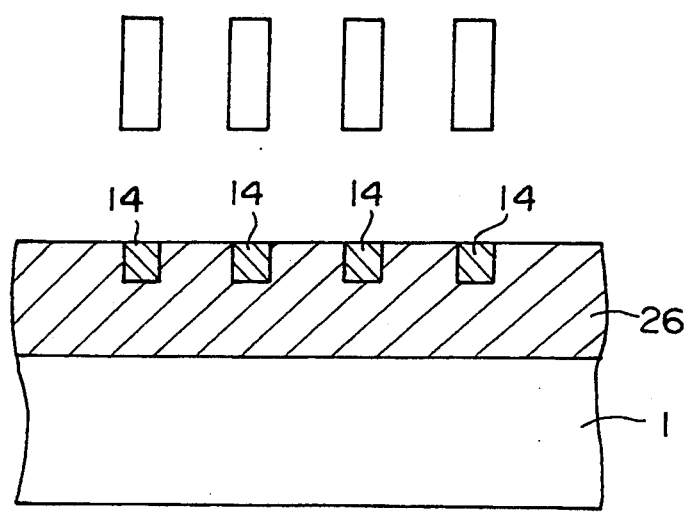
FIG. 35 is a partial sectional view illustrating a forming process of the resist pattern in Example 7 of the present invention.

In a process shown in FIG. 35, the positive X-ray photoresist layer 26 obtained in the process shown in FIG. 34 is subjected to reduction lithography by using X rays having a wavelength of 130 $\mu$m. In this reduction lithography, an upper layer of 0.3 $\mu$m of the positive X-ray photoresist layer 26 is exposed, and this portion becomes an exposed portion 14. In this reduction lithography, it is sufficiently resolved up to a width of 0.05 $\mu$m.

Figure 36:
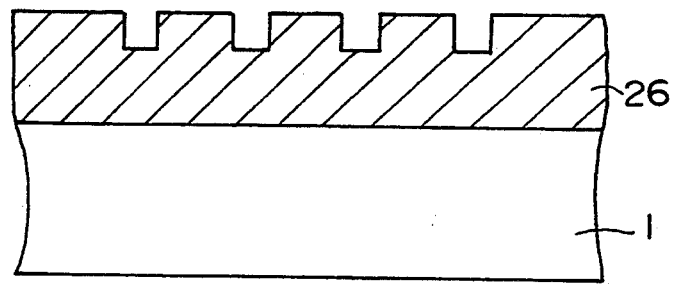
FIG. 36 is a partial sectional view illustrating a forming process of the resist pattern in Example 7 of the present invention.

In a process shown in FIG. 36, the exposed portion 14 obtained in the process shown in FIG. 35 is selectively removed, and then, the positive X-ray photoresist layer 26 is overall exposed by using the X rays having the same wavelength as that used in the reduction lithography.

Figure 37:
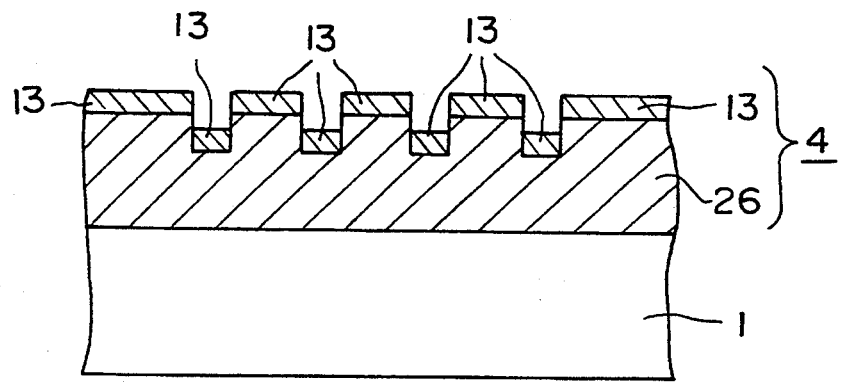
FIG. 37 is a partial sectional view illustrating a forming process of the resist pattern in Example 7 of the present invention.

In a process shown in FIG. 37, gold (Au) is deposited by sputtering on an upper surface of the positive X-ray photoresist layer 26 which has been overall exposed in the process shown in FIG. 36, and an X-ray absorbing layer 13 having a film thickness of about 0.1 to 0.2 $\mu$m is formed. Here, the X-ray absorbing layer 13 is formed to have the film thickness thinner than a step portion formed in the upper surface of the positive X-ray photoresist layer In this manner, a multi-resist layer 4 comprised of the positive X-ray photoresist layer 26 and the X-ray absorbing layer 13 is formed.

Figure 38:
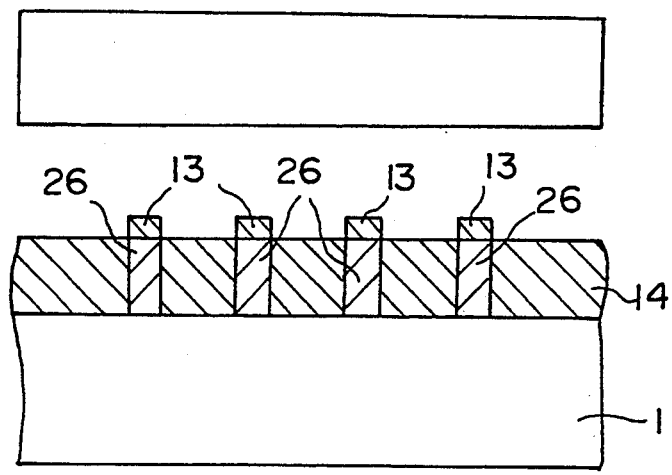
FIG. 38 is a partial sectional view illustrating a forming process of the resist pattern in Example 7 of the present invention.

In a process shown in FIG. 38, the positive X-ray photoresist layer 26 which has been overall exposed in the process shown in FIG. 36 is subjected to wet etching by using a desired developer, for example, "NMD-3" (trade name) manufactured by Tokyo Ohka Kogyo, Co., Japan. This process is generally similiar to the process described with reference to FIG. 32. At this time, since side walls of a convex portion (the non-exposed portion in the reduction lithography) of the positive X-ray photoresist layer 26 are exposed, the developer intrudes into these portions, however, in a concave portion, since the X-ray absorbing layer 13 serves as a mask, the developer is difficult to intrude. Accordingly, only the convex portion is lift off. In this manner, a fine pattern constituted only by the X-ray absorbing layer 13 is formed on the positive X-ray photoresist layer 26. This fine pattern is used as a mask for proximity lithography performed in a later process, however, since this mask has been patterned by the reduction lithography, it is highly accurate. Subsequently, the proximity lithography of the positive X-ray photoresist layer 26 is performed by using as a mask the X-ray absorbing layer 13, and by using X rays having a wavelength of 44 to 80 Å. At this time, for example, a width of about 10 Å at a long wavelength side of an absorption edge of carbon (C) is preferable. Since the X rays having the wavelength of 44 to 80 Å is absorbed by the X-ray absorbing layer 13, a region except for the X-ray absorbing layer 13 becomes an exposed portion 14. In this manner, the fine pattern can be duplicated with good accuracy in a depth direction of the X-ray photoresist layer 26.

Figure 39:
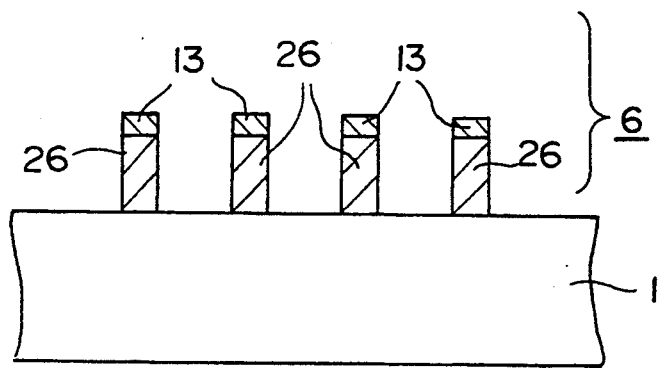
FIG. 39 is a partial sectional view illustrating a forming process of the resist pattern in Example 7 of the present invention.

In a process shown in FIG. 39, the exposed portion 14 obtained in the process described in the preceding paragraph and as shown in FIG. 38 is selectively removed, and a resist pattern 6 (generally similar to that illustrated in FIG. 33 but comprised of the X-ray absorbing layer 13 and the X-ray photoresist layer 26) having a required film thickness and having a highly accurate pattern duplicated thereon is formed on the substrate 1.

Here, in Example 7, in the process shown in FIG. 37, the X-ray absorbing layer 13 comprised of Au is formed to have the film thickness of about 0.1 μm. Thus, in the process described in the two preceding paragraphs and as shown in FIG. 38, the proximity lithography is performed by using the X rays having the wavelength of 44 to 80 Å. However, if the X-ray absorbing layer 13 is formed to the film thickness of about 0.5 μm, it will be possible to perform the proximity lithography by using the X rays having the wavelength of 4 to 10 Å, or preferably 6 to 10 Å, and the duplication accuracy will be more improved.

While, in Examples 3 to 7, the SOR is used as the light source, the light source is not limited to this, and other light sources may be used.

Furthermore, although the multilayer film of Mo/Si is used as the mask for reduction lithography, it is not limited to this, and a multilayer film of Au/C may be used.

In Examples 1 to 7, the wavelength of the X rays may be determined depending on an X-ray photoresist layer to be used, and a desired X-ray absorbing agent such as Si, Au, Re, etc., may be used in accordance with the wavelength.

In Examples 1 to 7, positive X-ray photoresist layers are employed. In a case, a negative X-ray photoresist is employed, it will be easily understood by a person skilled in the art, to add the steps of removing the X-ray absorbing layer and developing the first X-ray photoresist, after the X-ray proximity lithography.

In the present invention the following advantages are offered.

In the first aspect of the invention, the film thickness of the photoresist layer which contains the X-ray absorbing agent and in which a pattern is drawn is only required to have a thickness needed as a mask for patterning the X-ray photoresist layer. Accordingly, when a normal exposure technique is performed, even a considerably fine pattern can be formed with good accuracy. Furthermore, since it is used as a mask for the X-ray exposure, highly accurate pattern duplication can be achieved by utilizing the X-ray lithography without encountering any difficulty.

In the second aspect of the invention, by selectively exposing and developing the multi-resist layer, the patterning of the photoresist layer containing the X-ray absorbing agent can be performed with high accuracy. Thereafter, when X-ray exposure is carried out, since the patterned photoresist layer containing the X-ray absorbing agent serves as a mask for the X-ray exposure, it is possible to pattern the X-ray photoresist layer with good accuracy. Subsequently, by developing, it is possible to manufacture a highly accurate resist pattern in which the positioning accuracy and an alignment accuracy are improved.

In the third aspect of the invention, the reduction lithography using the X rays is selectively performed with respect to the X-ray photoresist layer, and a mask for the proximity lithography using the X rays which is performed in a later process is patterned in an upper layer of the X-ray photoresist layer. As a result, a very accurate mask which is sufficiently adaptable for the proximity lithography can be formed. Furthermore, by performing the proximity lithography, the fine pattern can be duplicated in a depth direction of the X-ray photoresist layer with good accuracy. Accordingly, the defects of the reduction lithography and the proximity lithography can be compensated for to each other Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

In the fourth aspect of the invention, the second X-ray photoresist layer formed on the first X-ray photoresist layer is subjected to selective reduction lithography, and a mask for the proximity lithography using the X rays which is used in a later process is formed by patterning on the first X-ray photoresist layer. As a result, a very accurate mask which is sufficiently adaptable for the proximity lithography can be formed. Furthermore, by performing the proximity lithography, the fine pattern can be duplicated in a depth direction of the first X-ray photoresist layer. For this reason, the defects of the reduction lithography and the proximity lithography can be compensated for to each other. Furthermore, since the mask for the proximity lithography can be formed directly on the first X-ray photoresist layer, the resolution of the proximity lithography can be improved. As a result, the photoresist pattern having a required film thickness and at the same time, having an accurate pattern duplicated thereon can be obtained in a simple manner.

In the fifth aspect of the invention, the first X-ray photoresist layer, the X-ray absorbing layer, and the second X-ray photoresist layer are sequentially formed, and thereafter, the reduction lithography of the second X-ray photoresist layer is performed by using the X rays. Then, by patterning a mask used in a later process for the proximity lithography using the X rays on the first X-ray photoresist layer, it is possible to form a very fine pattern sufficiently adaptable for the proximity lithography. Subsequently, by performing the proximity lithography, the fine pattern can be duplicated in a depth direction of the first X-ray photoresist layer with good accuracy. For this reason, the defects of the reduction lithography and the proximity lithography can be compensated for to each other. Furthermore, since the mask for the proximity lithography can be formed directly on the X-ray photoresist layer, the resolution of the proximity lithography can be improved. As a result, the photoresist pattern having a required film thickness and at the same time, having an accurate pattern duplicated thereon can be obtained in a simple manner.

In the sixth aspect of the invention, on the first positive X-ray photoresist layer, there is formed with the second positive X-ray photoresist layer which has the higher sensitivity than the first positive X-ray photoresist layer and which is photosensitive to the X rays. The reduction lithography of the second positive X-ray photoresist layer is performed selectively, and by patterning a mask used in a later process for the proximity lithography using the X rays on the first X-ray photoresist layer, it is possible to form a very fine pattern sufficiently adaptable for the proximity lithography. Furthermore, by performing the proximity lithography, the fine pattern can be duplicated in a depth direction of the first X-ray photoresist layer. For this reason, the defects of the reduction lithography and the proximity lithography can be compensated for to each other. Furthermore, since the mask for the proximity lithography can be formed directly on the first X-ray photoresist layer, the resolution of the proximity lithography can be improved. As a result, the photoresist pattern having a required film thickness and at the same time, having an accurate pattern duplicated thereon can be obtained in a simple manner.

In the seventh aspect of the invention, the reduction lithography of the positive X-ray photoresist layer is performed selectively, and by patterning a mask used in a later process for the proximity lithography using the X rays on the positive X-ray photoresist layer, it is possible to form a very fine pattern sufficiently adaptable for the proximity lithography. Furthermore, by performing the proximity lithography, the fine pattern can be duplicated in a depth direction of the positive X-ray photoresist layer. For this reason, the defects of the reduction lithography and the proximity lithography can be compensated for to each other. Furthermore, since the mask for the proximity lithography can be formed directly on the positive X-ray photoresist layer, the resolution of the proximity lithography can be improved. As a result, the photoresist pattern having a required film thickness and at the same time, having an accurate pattern duplicated thereon can be obtained in a simple manner.

What is claimed is:

1. A method of forming a resist pattern which uses a multilayer resist, comprising: a first step of forming an X-ray photoresist layer photosensitive to X rays on a substrate; a second step of forming a photoresist layer containing an X-ray absorbing agent on the X-ray photoresist layer; a third step of selectively exposing the photoresist layer containing the X-ray absorbing agent to form an image portion and a non-image portion; a fourth step of selectively removing the non-image portion of the photoresist layer containing the X-ray absorbing agent; and a fifth step of exposing the X-ray photoresist layer to the X rays by using the image portion of the photoresist layer containing the X-ray absorbing agent as a mask.

2. The method of claim 1, wherein said third step is performed by a process selected from the group consisting of: photolithography, excimer laser lithography, phase shift technique, and electron beam technique.

3. A method of forming a resist pattern which uses a multilayer resist, comprising: a first step of forming an X-ray photoresist layer photosensitive to X rays on a substrate; a second step of selectively performing reduction lithography of the X-ray photoresist layer by using the X rays to form an image portion and a non-image portion; a third step of selectively diffusing an X-ray absorbing agent into the image portion of the X-ray photoresist layer; a fourth step of selectively removing the non-image portion of the X-ray photoresist layer; and a fifth step of performing proximity lithography of the X-ray photoresist layer after the selective removal thereof by using the X rays having a wavelength which is absorbed by the X-ray absorbing agent and by using as a mask the X-ray photoresist layer diffused with the X-ray absorbing agent.

4. A method of forming a resist pattern which uses a multilayer resist, comprising: a first step of forming a first X-ray photoresist layer photosensitive to X rays on a substrate; a second step of forming on the first X-ray photoresist layer a second X-ray photoresist layer which contains an X-ray absorbing agent and which is photosensitive to X rays having a wavelength, at which wavelength a small amount of the X rays are absorbed by the X-ray absorbing agent; a third step of selectively performing reduction lithography of the second X-ray photoresist layer by using the X rays having the wavelength, at which wavelength a small amount of the X rays are absorbed, to form an image portion and a non-image portion; a fourth step of selectively removing the non-image portion of the second X-ray photoresist layer; and a fifth step of performing proximity lithography of the first X-ray photoresist layer by using as a mask the second X-ray photoresist layer after the selective removal thereof and by using the X rays having a wavelength which is absorbed by the X-ray absorbing agent.

5. A method of forming a resist pattern which uses a multilayer resist, comprising: a first step of forming a first X-ray photoresist layer photosensitive to X rays on a supporting board; a second step of forming an X-ray absorbing layer on the first X-ray photoresist layer; a third step of forming on the X-ray absorbing layer a second X-ray photoresist layer photosensitive to the X rays; a fourth step of selectively performing reduction lithography of the second X-ray photoresist layer by using the X rays to form an image portion and a non-image portion; a fifth step of selectively removing the non-image portion of the second X-ray photoresist layer; a sixth step of removing the second X-ray photoresist layer after the X-ray absorbing layer is selectively removed by using as a mask the second X-ray photoresist layer after the selective removal thereof; and a seventh step of performing proximity lithography of the first X-ray photoresist layer by using as a mask the X-ray absorbing layer after the selective removal thereof and by using the X rays having a wavelength which is absorbed by the X-ray absorbing layer.

6. A method of forming a resist pattern which uses a multilayer resist, comprising: a first step of forming on a substrate a first X-ray photoresist layer photosensitive to X rays; a second step of forming on the first X-ray photoresist layer a second X-ray photoresist layer which has higher sensitivity than the first X-ray photoresist layer and which is photosensitive to the X rays; a third step of selectively performing reduction lithography of the second X-ray photoresist layer by using the X rays; a fourth step of selectively removing an exposed portion of the second X-ray photoresist layer; a fifth step of performing overall exposure of the second X-ray photoresist layer after the selective removal thereof and of the first X-ray photoresist layer which is exposed due to the selective removal thereof, by using the X rays having the same wavelength as that used in the reduction lithography; a sixth step of forming an X-ray absorbing layer on an upper surface of both the X-ray photoresist layers, the X-ray absorbing layer having a film thickness thinner than a film thickness of the second X-ray photoresist layer; a seventh step of selectively removing the second X-ray photoresist layer and the X-ray absorbing layer formed on the upper surface of the second X-ray photoresist layer; and an eighth step of performing proximity lithography of the first X-ray photoresist layer by using as a mask the X-ray absorbing layer after the selective removal thereof and by using the X rays having a wavelength which is absorbed by the X-ray absorbing layer.

7. A method of forming a resist pattern which uses a multilayer resist, comprising: a first step of forming on a substrate a X-ray photoresist layer photosensitive to X rays; a second step of selectively performing reduction lithography of the X-ray photoresist layer by using the X rays; a third step of selectively removing an exposed portion of the X-ray photoresist layer; a fourth step of performing overall exposure of the X-ray photoresist layer after the selective removal thereof by using the X rays having a wavelength same as that used in the reduction lithography; a fifth step of forming an X-ray absorbing layer on an upper surface of the X-ray photoresist layer after the overall exposure thereof, the X-ray absorbing layer having a film thickness thiner than a step portion caused in the X-ray photoresist layer due to the selective removal thereof; a sixth step of selectively removing the X-ray photoresist layer having the X-ray absorbing layer formed thereon; and a seventh step of performing proximity lithography of the X-ray photoresist layer by using as a mask the X-ray absorbing layer after the selective removal thereof and by using the X rays having a wavelength which is absorbed by the X-ray absorbing layer.

8. A method of forming a resist pattern comprising the steps of:

forming an X-ray resist layer on a substrate;

forming a pattern of a resist containing an X-ray absorbing agent on said X-ray resist layer; and exposing said X-ray resist layer to X-rays by using said pattern of the resist containing the X-ray absorbing agent as a mask.

9. The method of claim 8, wherein said step of forming a pattern of a resist containing an X-ray absorbing agent on said X-ray resist layer is performed by a process selected from the group consisting of: photolithography, excimer laser lithography, phase shift technique, X-ray reduction lithography, and electron beam technique.

10. A method of forming a resist pattern comprising the steps of:

forming an X-ray resist layer on a substrate;

forming a pattern of an X-ray absorbing layer on said X-ray resist layer; and exposing said X-ray resist layer to X-rays by using said pattern of the X-ray absorbing layer as a mask.

11. The method of claim 10, wherein said step of forming a pattern of an X-ray absorbing layer on said X-ray resist layer is performed by a process selected from the group consisting of: photolithography, excimer laser lithography, phase shift technique, X-ray reduction lithography, and electron beam technique.

* * * * *